(12) United States Patent
Huang et al.

(10) Patent No.: US 9,117,901 B2
(45) Date of Patent: Aug. 25, 2015

(54) HIGH VOLTAGE DEVICE AND MANUFACTURING METHOD THEREOF

(71) Applicants: Tsung-Yi Huang, Hsinchu (TW); Chien-Hao Huang, Magong (TW)

(72) Inventors: Tsung-Yi Huang, Hsinchu (TW); Chien-Hao Huang, Magong (TW)

(73) Assignee: RICHTEK TECHNOLOGY CORPORATION, R.O.C., Chupei, Hsin-Chu (TW)

( * ) Notice: Subject to any disclaimer, the term of this patent is extended or adjusted under 35 U.S.C. 154(b) by 0 days.

(21) Appl. No.: 14/592,306

(22) Filed: Jan. 8, 2015

(65) Prior Publication Data

US 2015/0123198 A1    May 7, 2015

Related U.S. Application Data

(62) Division of application No. 13/235,366, filed on Sep. 17, 2011, now Pat. No. 8,963,237.

(51) Int. Cl.
| | |
|---|---|
| *H01L 29/78* | (2006.01) |
| *H01L 21/8234* | (2006.01) |
| *H01L 29/66* | (2006.01) |
| *H01L 29/06* | (2006.01) |
| *H01L 29/08* | (2006.01) |
| *H01L 29/417* | (2006.01) |
| *H01L 29/423* | (2006.01) |
| *H01L 29/10* | (2006.01) |

(52) U.S. Cl.
CPC .... *H01L 29/7816* (2013.01); *H01L 21/823418* (2013.01); *H01L 29/0634* (2013.01); *H01L 29/0692* (2013.01); *H01L 29/0886* (2013.01); *H01L 29/66659* (2013.01); *H01L 29/7835* (2013.01); *H01L 29/1045* (2013.01); *H01L 29/41758* (2013.01); *H01L 29/423* (2013.01)

(58) Field of Classification Search
CPC ..................... H01L 29/6659; H01L 29/7833
USPC .......................................... 257/500, 335, 337
See application file for complete search history.

(56) References Cited

U.S. PATENT DOCUMENTS 6,353,252 B1 * 3/2002 Yasuhara et al. .............. 257/487

* cited by examiner

*Primary Examiner* — Yu-Hsi D Sun
(74) *Attorney, Agent, or Firm* — Tung & Associates

(57) ABSTRACT

The present invention discloses a high voltage device and a manufacturing method thereof. The high voltage device includes: a substrate, having an isolation structure for defining a device region; a drift region located in the device region, wherein from top view, the drift region includes multiple sub-regions separated from one another but are electrically connected with one another; a source and a drain in the device region; and a gate on the surface of the substrate and between the source and drain in the device region.

7 Claims, 6 Drawing Sheets

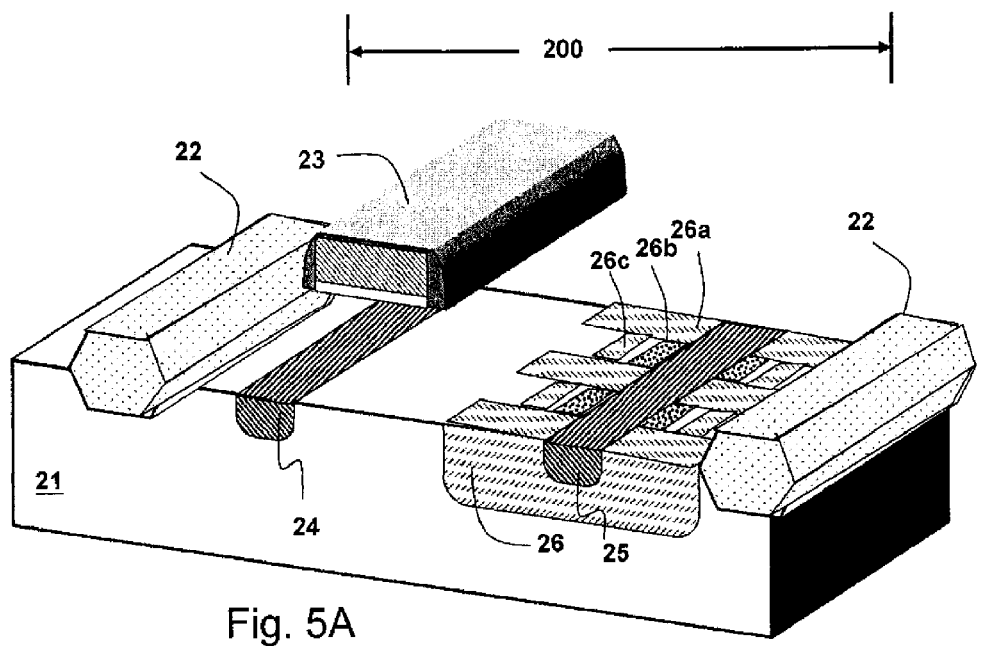
Fig. 5A
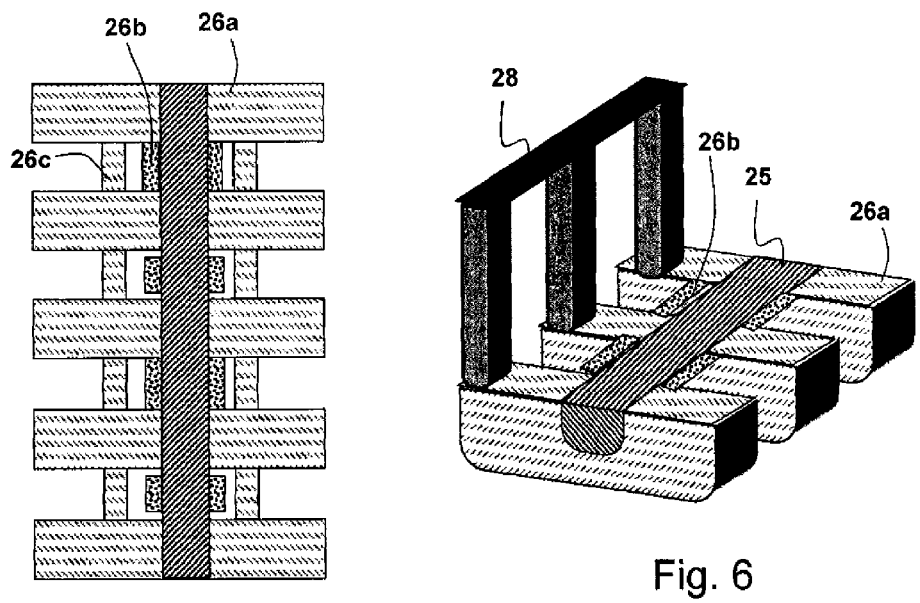
Fig. 5B
Fig. 6

HIGH VOLTAGE DEVICE AND MANUFACTURING METHOD THEREOF

CROSS REFERENCE

The present application is a divisional application of U.S. Ser. No. 13/235,366, filed on Sep. 17, 2011.

BACKGROUND OF THE INVENTION

1. Field of Invention

The present invention relates to a high voltage device and a manufacturing method thereof, in particular to such device with an enhanced breakdown voltage and a method for manufacturing the device, in which the high voltage device and the low voltage device can be manufactured by common manufacturing process steps.

2. Description of Related Art

FIGS. 1A and 1B respectively show a cross-section view and a 3D (3-dimensional) view of a prior art double diffused drain metal oxide semiconductor (DDDMOS) device which is manufactured by the following steps: as shown in FIGS. 1A and 1B, forming an isolation structure 12 in a P-type substrate 11 to define a device region 100, wherein the isolation structure 12 is, for example, a shallow trench isolation (STI) structure or a local oxidation of silicon (LOCOS) structure; and forming a gate 13, a source 14, a drain 15 and a drift region 16 in the first device region 100. The drift region 16, the drain 15 and the source 14 are formed by a lithography process and an ion implantation process, wherein the lithography process defines the implantation regions by a photoresist mask together with a self-alignment effect provided by all or a part of the gate 13 and the isolation region 12, and the ion implantation process implants N-type impurities to the drift region 16, the drain 15 and the source 14. The drain 15 and the source 14 are at different sides of the gate 13 respectively, and the drift region 16 partially interfaces with the bottom surface of the gate 13 at a side of the gate 13 closer to the drain 15 than the source 14. The DDDMOS device is a high voltage device designed for applications requiring higher operation voltages. However, if it is required for the DDDMOS device to be integrated with a low voltage device in one substrate, the high voltage device and the low voltage device should adopt the same manufacturing process steps with the same ion-implantation parameters, and thus the flexibility of the ion-implantation parameters for the DDDMOS device is limited; as a result, the DDDMOS device has a lower breakdown voltage and a limited application range. To increase the breakdown voltage of the DDDMOS device, additional manufacturing process steps are required, that is, other lithography process and ion implantation process are required in order to provide different ion-implantation parameters, but this increases to cost.

In view of above, to overcome the drawbacks in the prior art, the present invention proposes a high voltage device and a manufacturing method thereof which provide a higher breakdown voltage and a broader application range for the high voltage device, in which additional manufacturing process steps are not required such that the high voltage device and the low voltage device can be manufactured by common manufacturing process steps.

SUMMARY OF THE INVENTION

The objectives of the present invention are to provide a high voltage device and its manufacturing method.

To achieve the foregoing objectives, the present invention provides a high voltage device, comprising: a substrate, having an isolation structure for defining a device region; a drift region located in the device region, wherein from top view, the drift region includes multiple sub-regions separated from one another but are electrically connected with one another; a source and a drain in the device region; and a gate on the surface of the substrate and between the source and drain in the device region.

The foregoing high voltage device may further include a well region surrounding the source and having a different conductive type from that of the source, wherein the well region and the drift region are located at different horizontal positions and are separated from one the other.

The foregoing high voltage device may further include buffer regions located at two different sides of the drain.

In the foregoing high voltage device, the multiple sub-regions may be electrically connected with one another via the buffer region.

In the foregoing high voltage device, the multiple sub-regions may be electrically connected with one another via a connection region or at least one wire.

A low voltage device having a lightly doped drain (LDD) may be formed on the same substrate, and the LDD of the low voltage device and the drift region of the high voltage device can be formed at least partially by the same process step.

In another perspective of the present invention, it provides a method for manufacturing a high voltage device, comprising: providing a substrate, and forming an isolation structure in the substrate to define a device region; forming a drift region located in the device region, wherein from top view, the drift region includes multiple sub-regions separated from one another but are electrically connected with one another; forming a source and a drain in the device region; and forming a gate on the surface of the substrate and between the source and drain in the device region.

The objectives, technical details, features, and effects of the present invention will be better understood with regard to the detailed description of the embodiments below, with reference to the drawings.

BRIEF DESCRIPTION OF THE DRAWINGS

FIGS. 5A-5B show a third embodiment according to the present invention.

FIG. 6 shows a fourth embodiment according to the present invention.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
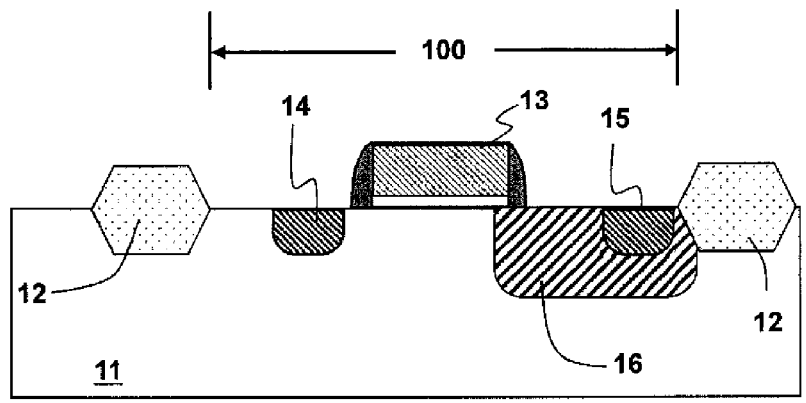
FIG. 1A shows, by cross-section view, a prior art DDDMOS device.
Figure 1B:
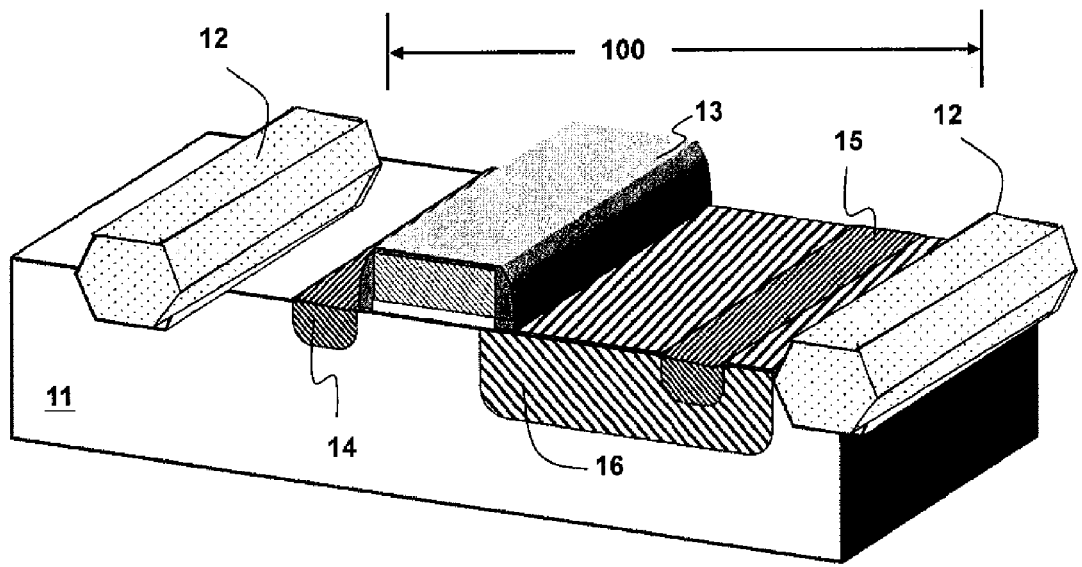
FIG. 1B shows, by 3D view, a prior art DDDMOS device.
Figure 2A:
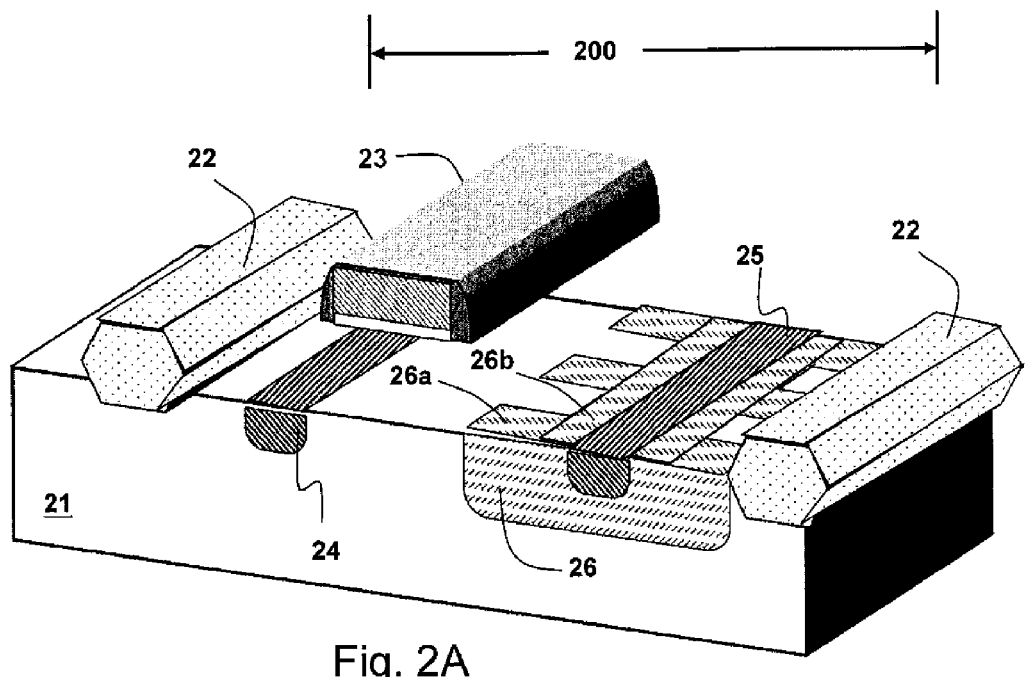
FIGS. 2A-2B show a first embodiment according to the present invention.
Figure 2B:
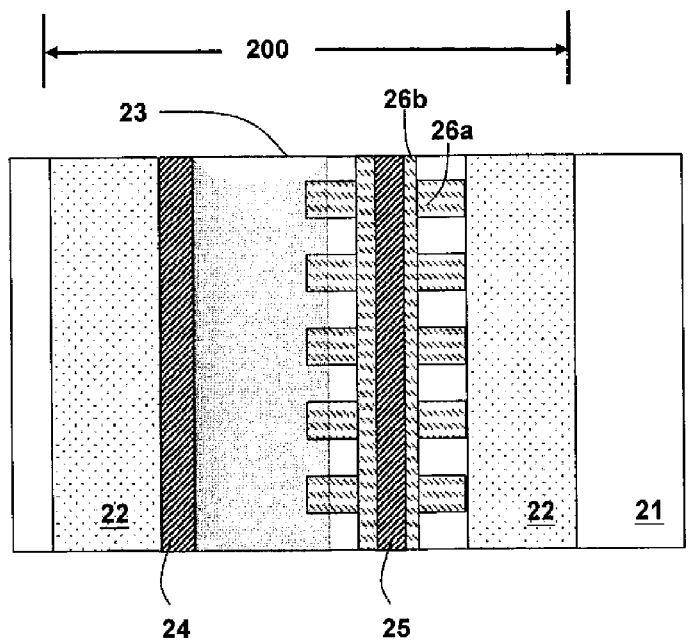

Please refer to FIGS. 2A-2B for a first embodiment according to the present invention, wherein FIGS. 2A and 2B show a 3D view and a top view of a DDDMOS device according to the present invention, respectively. It should be explained that in some of the figures the gate 23 is shown to be separated from the substrate 21 or is shown to be transparent for purpose of better illustrating the feature of the present invention; the gate 23 and the substrate 21 are in physical contact with each other in practical case. As shown in FIG. 2A-2B, a substrate 21 is provided, in which is formed an isolation structure 22 to define a device region 200, wherein substrate 21 is, for example but not limited to, a P-type substrate, and the isolation structure 22 is, for example, an STI or a LOCOS structure. A gate 23, a source 24, a drain 25 and a drift region 26 are formed in the device region 200, wherein the source 24 and the drain 25 are, for example but not limited to, N-type regions. Different from the prior art, the drift region 26 (for example but not limited to an N-type region) includes multiple sub-regions 26a separated from one another, the multiple sub-regions 26a at one side of the drain 25 are electrically connected with one another via a buffer region 26b, and the multiple sub-regions 26a and the buffer region 26b together form a fence-shaped structure. There is a buffer region 26b located at each of the two sides of the drain 25 for preventing the drain 25 from directly contacting with the P-type conductive region of the substrate 21. This arrangement has the following advantages: First, in device characteristics, the present invention enhances the breakdown voltage of the DDDMOS device. Second, in manufacturing process, if the DDDMOS device is manufactured in a wafer including other low voltage devices, the drift region 14 can be formed together with the lightly doped drains (LDD) of those other low voltage devices by the same mask and process steps so that no additional mask or process step is required. Therefore, the DDDMOS device in the present invention can be manufactured by a lower cost than the prior art.

Figure 3A:
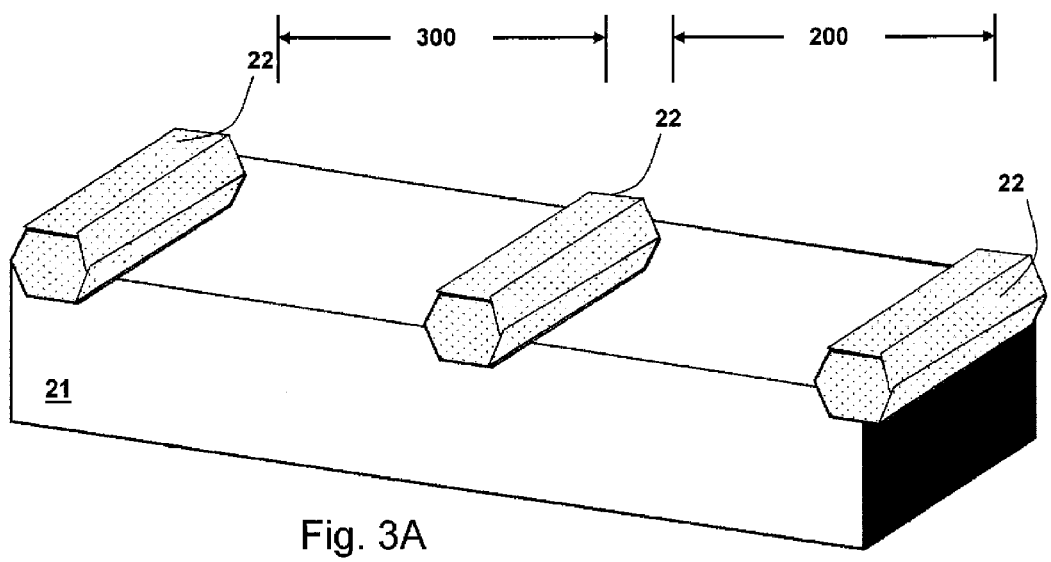
FIGS. 3A-3D show manufacturing process steps of the first embodiment according to the present invention.
Figure 3B:
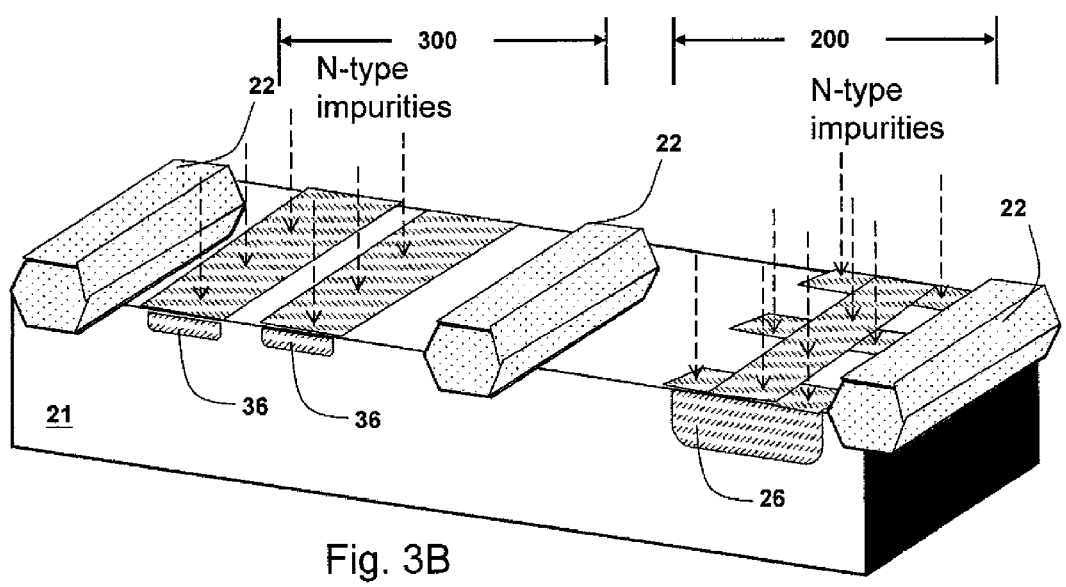
Figure 3C:
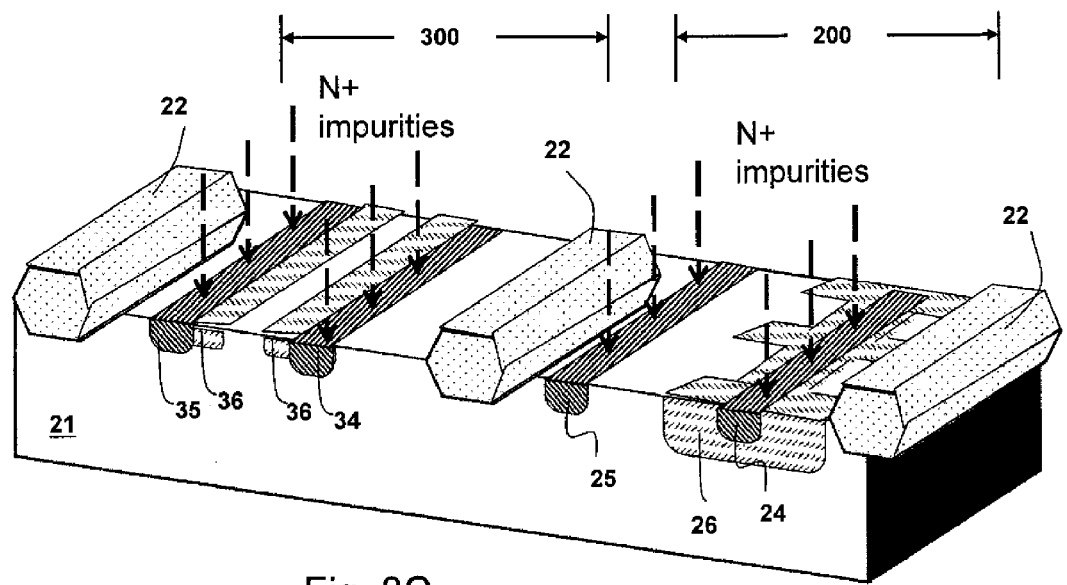
Figure 3D:
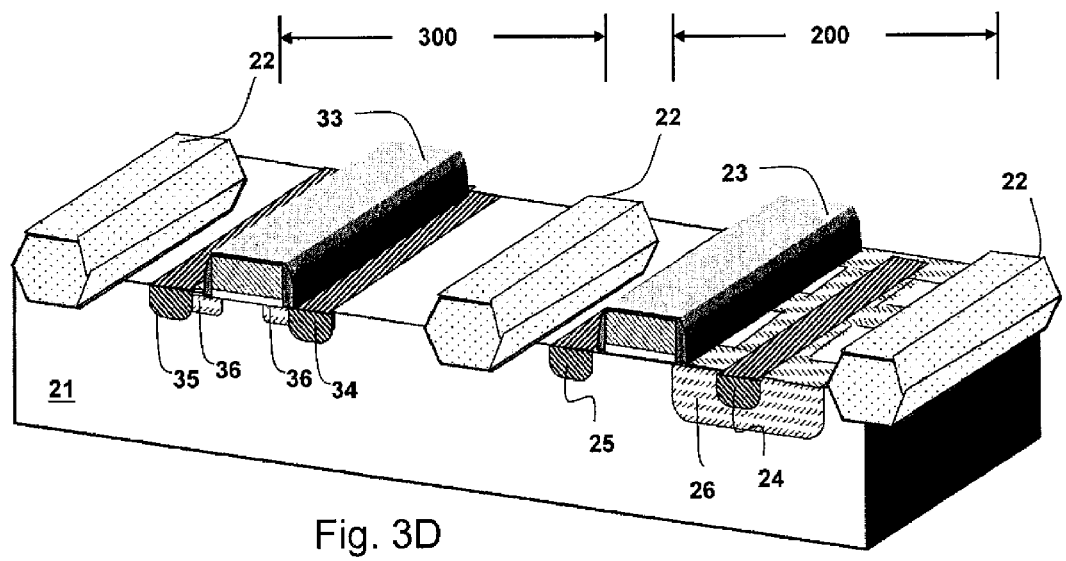
Figure 3E:
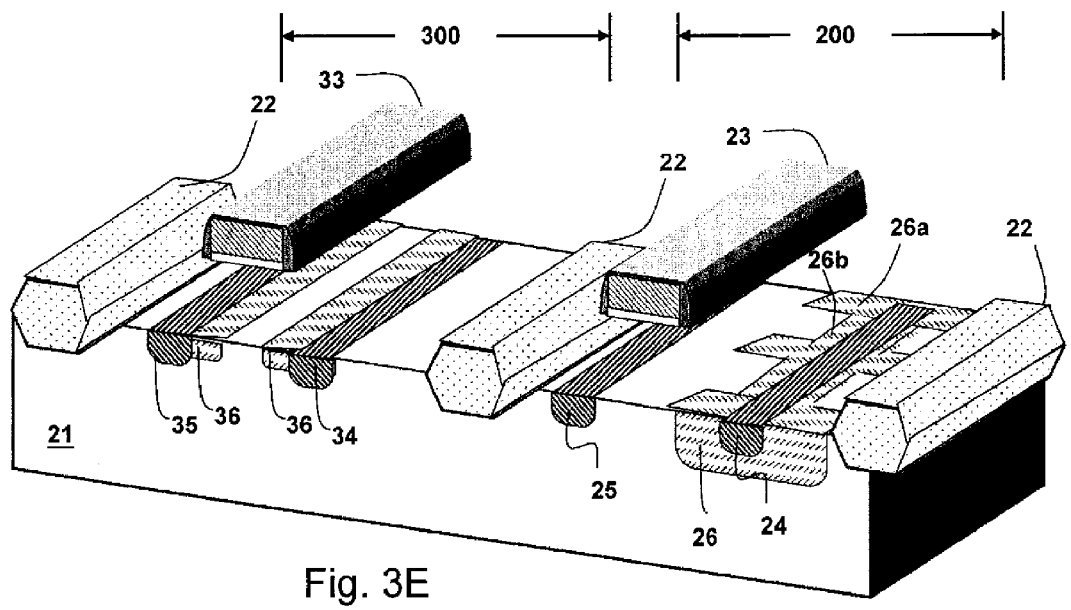
FIG. 3E shows the first embodiment according to the present invention.

Please refer to FIGS. 3A-3D for the manufacturing process steps of the first embodiment according to the present invention. First, as shown in FIG. 3A, the substrate 21 is provided, in which is formed the isolation structure 22 to define the device regions 200, 300, wherein the high voltage DDDMOS device is formed in the device region 200 while a low voltage device is formed in the device region 300. Second, as shown in FIG. 3B, lightly doped drains (LDD) 36 of the low voltage device are formed by doping N-type impurities, and the drift region 26 of the high voltage device and the LDD 36 are formed by the same process steps on the same substrate 21. Next, as shown in FIG. 3C, an ion implantation process is performed in the device regions 200, 300 to form sources 24, 34 and drains 25, 35 with a higher dosage of N-type impurities (N+ impurities), respectively. Finally, as shown in FIG. 3D, the gate 23 is formed on the substrate 21 between the source 24 and the drain 25 in the device region 200, and a gate 33 is formed on the substrate 21 between the source 34 and the drain 35 in the device region 300, respectively. FIG. 3E show the same structure as FIG. 3D, but in FIG. 3E, the gates 23, 33 are shown to be separated from the substrate 21 for purpose of better illustrating the feature of the present invention; the gates 23, 33 are in physical contact with the substrate 21 in practical case. It should be explained that the structure shown in FIGS. 3A-3E is for illustration only and should not be taken as a limitation to the present invention; for example, the number and shape of the multiple sub-regions 26a are not limited to what are shown in the figures, and the number and shape of the buffer region 26b are not limited to what are shown in the figures.

Figure 4:
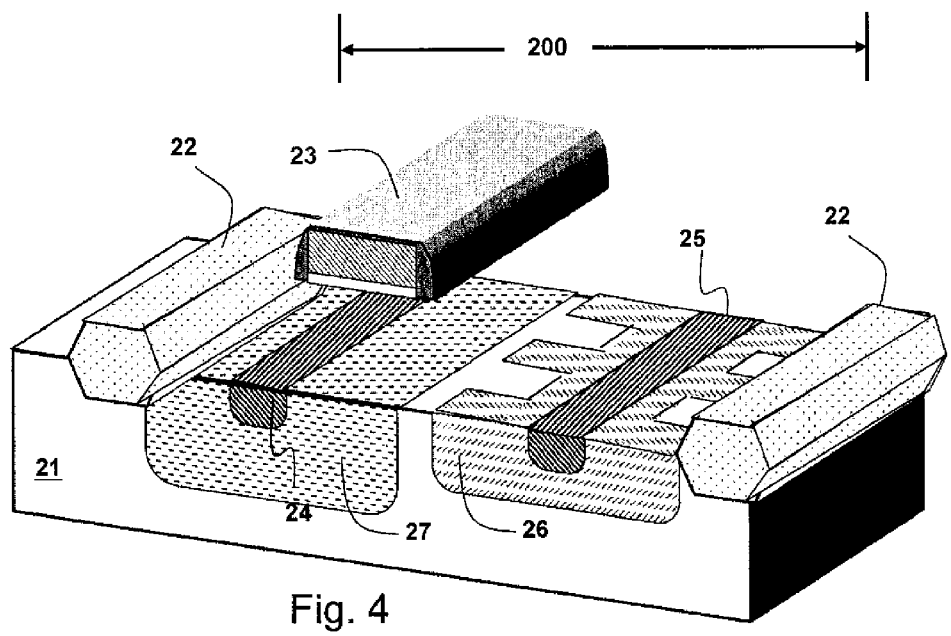
FIG. 4 shows a second embodiment according to the present invention.

FIG. 4 shows a second embodiment according to the present invention. In FIG. 4, the gate 23 is also shown to be separated from the substrate 21 for purpose of better illustrating the feature of the present invention, but the gate 23 and the substrate 21 are in physical contact with each other in practical case. As shown in FIG. 4, a substrate 21 is provided, in which are formed a P-type well region 27 and an isolation structure 22 to define a device region 200, wherein the P-type well region 27 is, for example but not limited to, a P-type region, and the isolation structure 22 is, for example, an STI or a LOCOS structure. A gate 23, a source 24, a drain 25 and a drift region 26 are formed in the device region 200, wherein the source 26 and the drain 25 are, for example but not limited to, N-type regions. This embodiment is different from the first embodiment in that this embodiment has the P-type well region 27, wherein the P-type well region 27 and the drift region 26 are located at different horizontal positions and are separated from one the other. This embodiment has the same advantages over the prior art as what the first embodiment has.

FIGS. 5A-5B show a third embodiment according to the present invention, wherein FIGS. 5A and 5B show a 3D view and a top view of this embodiment, respectively. The gate 23 is shown to be separated from the substrate 21 in FIG. 5A, and some parts of the high voltage device are omitted in FIG. 5B for purpose of better illustrating the feature of the present invention. Different from the first embodiment, the multiple sub-regions 26a are not electrically connected with one another via the buffer regions 26b, but via the connection regions 26c. Please refer to FIGS. 5A-5B together with FIGS. 2A-2B. In FIGS. 5A-5B and FIGS. 2A-2B, the buffer regions 26b are provided between the substrate 21 and the drain 25 for the same purpose of preventing the drain 25 from directly contacting with the P-type region of the substrate 21. In FIGS. 2A-2B, the buffer regions 26b also provide the function of electrically connecting the multiple sub-regions 26a, but such connection does not necessarily have to be achieved by, or only by the buffer regions 26b; in FIGS. 5A-5B, the multiple sub-regions 26a are also electrically connected with one another via the connection regions 26c.

FIG. 6 shows a top view of a fourth embodiment according to the present invention. Some parts of the high voltage device are omitted in the figure for purpose of better illustrating the feature of the present invention. Different from the first embodiment, the multiple sub-regions 26a are electrically connected with one another primarily via a wire 28.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, the multiple sub-regions 26a are shown as strip-shaped or block-shaped regions in the above embodiments, but they also can be circle-shaped, oval-shaped, polygon-shaped, jag-shaped, wave-shaped, lightning-shaped, or any regular or irregular shaped regions. As another example, other manufacturing process steps or structures which do not affect the characteristics of the device, such as a deep-well region, etc., can be added. Further, the lithography process is not limited to photolithography; it can be electron beam lithography, X-ray lithography or other methods. As yet another example, if the DDDMOS device of the present invention is manufactured in a wafer including other low voltage devices, the drift region 24 not only can be formed together with LDDs of other low voltage devices by the same mask and process steps, but also can be formed by another mask and other process steps. Thus, the present invention should cover all such and other modifications and variations, which should be interpreted to fall within the scope of the following claims and their equivalents.

What is claimed is:

1. A high voltage device comprising:
   a substrate of a conductivity type, having an isolation structure for defining a device region;
   a drift region located in the device region, wherein from top view, the drift region includes multiple sub-regions separated from one another by a portion of the substrate of the conductivity type in between but are electrically connected with one another, the portion of the substrate of the conductivity type including no drift region;
   a source and a drain in the device region, wherein the drain extends along a first direction and the multiple sub-regions are located at two different sides at a second direction of the drain, and wherein the multiple sub-regions at each of the two sides of the drain are connected to one another and the multiple sub-regions extends farther from the drain than where the multiple sub-regions are connected; and
   a gate on the surface of the substrate and between the source and drain in the device region, wherein the gate also extends along the first direction.

2. The high voltage device of claim 1, further comprising a well region surrounding the source and having a different conductive type from that of the source.

3. The high voltage device of claim 2, wherein the well region and the drift region are located at different horizontal positions and are separated from one the other.

4. The high voltage device of claim 1, further comprising buffer regions located at the two different sides of the drain.

5. The high voltage device of claim 4, wherein the multiple sub-regions are electrically connected with one another via the buffer regions.

6. The high voltage device of claim 1, wherein the multiple sub-regions are electrically connected with one another via a connection region or at least one wire.

7. The high voltage device of claim 1, wherein a low voltage device having a lightly doped drain (LDD) is formed on the substrate, and wherein the LDD and the drift region are formed at least partially by a same process step.

* * * * *